United States Patent
Matsuo et al.

(10) Patent No.: US 6,559,481 B2
(45) Date of Patent: May 6, 2003

(54) SEMICONDUCTOR DEVICE FOR PRECISE MEASUREMENT OF A FORWARD VOLTAGE EFFECT

(75) Inventors: Kazushige Matsuo, Fukuoka (JP); Eisuke Suekawa, Tokyo (JP); Kouichi Mochizuki, Fukuoka (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/075,393

(22) Filed: Feb. 15, 2002

(65) Prior Publication Data

US 2002/0139991 A1 Oct. 3, 2002

(30) Foreign Application Priority Data

Mar. 30, 2001 (JP) ........................................ 2001-099367
Dec. 11, 2001 (JP) ........................................ 2001-377179

(51) Int. Cl.[7] ........................ H01L 29/74; H01L 29/167
(52) U.S. Cl. ........................ 257/109; 257/112; 257/121; 257/656; 257/655; 257/653; 257/654
(58) Field of Search ........................ 257/109, 112, 257/121, 656, 655, 653, 654

(56) References Cited

U.S. PATENT DOCUMENTS 3,984,859 A * 10/1976 Misawa et al. ............. 257/495
4,982,245 A * 1/1991 Hanaoka et al. ............ 257/547

FOREIGN PATENT DOCUMENTS

JP 7-234162 9/1995

* cited by examiner

Primary Examiner—Minh Loan Tran
Assistant Examiner—Tan Tran
(74) Attorney, Agent, or Firm—Oblon, Spivak, McClelland, Maier & Neustadt, P.C.

(57) ABSTRACT

A semiconductor device such as an IGBT, for realizing measurement precision for forward voltage effect characteristics using a relatively small current. It includes a second conductivity type of first anode region formed to partially constitute the upper surface of a first conductivity type of semiconductor substrate and having an anode electrode formed on its upper surface, a second anode region formed within said first anode region, and an anode electrode formed on said second anode region. The second anode region is electrically isolated from the first anode region, and the anode electrode formed on the upper surface of the second anode region is independent of the anode electrode formed on the upper surface of the first anode region. In such semiconductor device having said second anode region, even though a small force current, measurement can be performed at a current density which is equal to or close to a rated current.

9 Claims, 6 Drawing Sheets

SEMICONDUCTOR DEVICE FOR PRECISE MEASUREMENT OF A FORWARD VOLTAGE EFFECT

BACKGROUND OF THE INVENTION

The present invention relates to a field effect semiconductor device such as an IGBT.

In recent years, in industrial devices and home electric devices, inverters have been advanced on a demand for saving energy. In order to answer the needs, an insulating gate bipolar transistor (to be referred to as an IGBT hereinafter) has rapidly spread. This IGBT is a kind of MOSFETs (MOS field effect transistors), and is a device in which a p-type layer is added to the drain of a MOSFET, and minor carriers are injected into the p-type layer to reduce the ON-resistance. Accordingly, the IGBT is a useful power device having merits such as gate voltage driving, high-speed switching characteristics, and unbreakable properties which are advantages of the MOSFET.

In general, upon completion of manufacturing a semiconductor wafer, the performance of the semiconductor wafer is checked in the wafer state. However, for example, when a forward voltage effect of the IGBT is to be measured, a current which can flow in the IGBT is regulated in relation to a measurement technique. For this reason, actually, measurement of the forward voltage effect of the IGBT is performed by a relative small current, and the forward voltage effect in an actual working current region should be predicted, so that the measurement precision cannot be avoided from being deteriorated.

In addition, when the IGBT is used, a feedback diode Bust be used. However, a forward voltage effect in a feedback diode is considerably related to the diode performance. For this reason, recognition of performance in a wafer state or feedback to manufacturing steps are very important. Also, in view of matter that the forward voltage effect is preferably made uniform when a plurality of elements are connected in parallel to each other, it is important to recognize the performance in the wafer state.

SUMMARY OF THE INVENTION

It is an object of the present invention to provide a semiconductor device for realizing measurement precision for forward voltage effect characteristics using a relatively small current.

The semiconductor device dealt with in this present invention includes a first conductivity type of semiconductor substrate, a first conductivity type of cathode region, a second conductivity type of first anode region, a peripheral region, and a marginal region. The first conductivity type of cathode region is formed on the lower side of the semiconductor substrate and has a cathode electrode formed on the lower surface of itself. The second conductivity type of first anode region is formed to partially constitute the upper surface of the semiconductor substrate and has an anode electrode formed on the upper surface of itself. The peripheral region is formed to surround the first anode region for assuring withstand voltage characteristics which are equal to or better than predetermined withstand voltage characteristics. The marginal region is formed to surround the peripheral region.

The semiconductor device in an aspect of the present invention further includes at least one second anode region formed in the first anode region, and an electrode formed on the upper surface of the second anode region. The second anode region is formed so as to be electrically isolated from the first anode region. The electrode is independent of the anode electrode on the first anode region.

Accordingly, measurement at a current density which is equal to or close to a rated current can be performed at a relatively small current.

In this semiconductor device, an upper surface area SA1 of said first anode region and an upper surface region SA2 of said second anode region satisfy a relationship represented by SA1>SA2. The upper surface shape of the second anode region has radiuses of curvature of not less than 10 $\mu$m at corners of the upper surface shape. An interval between said first anode region and said second anode region is set to be not less than 5 $\mu$m.

The second anode region can be arranged at almost center of the first anode region. Further, a plurality of second anode regions can be formed within said first anode region, and the respective second anode regions can be arranged at different corners in the first anode region.

The semiconductor device in another aspect of the present invention further includes an almost annular second conductivity type of semiconductor layer arranged within the peripheral region and surrounding the first anode region, and an electrode formed on the upper surface of the semiconductor layer. The electrode is independent of the anode electrode on the first anode region.

Accordingly, measurement at a current density which is equal to or close to a rated current can be performed at a relatively small current. Additionally, when the semiconductor layer is formed in the peripheral region, the structure of the conventional first anode region can be used without changing the first anode region.

The semiconductor device in still another aspect of the present invention further includes an almost annular second conductivity type of semiconductor layer arranged within the marginal region and surrounding the first anode region, and an electrode formed on the upper surface of the semiconductor layer. The electrode is independent of the anode electrode on the first anode region. Accordingly, measurement at a current density which is equal to or close to a rated current can be performed at a relatively small current. Additionally, when the semiconductor layer is formed in the terminal region, the structure of the conventional first anode region can be used without changing the first anode region.

Furthermore, the semiconductor device in another aspect of the present invention further includes an almost annular first or second conductivity type of semiconductor layer formed within the marginal region and surrounding the first anode region, a second anode region formed within a region defined between the semiconductor layer and the corners of the body, and an electrode formed on the upper surface of the second anode region. The second anode region is electrically isolated from the first or second conductivity type of semiconductor layer. The electrode is independent of the anode electrode on the first anode region.

Accordingly, measurement at a current density which is equal to or close to a rated current can be performed at a relatively small current. Additionally, when the semiconductor layer is formed in the peripheral region, the structure of the conventional first anode region can be used without changing the first anode region.

DETAILED DESCRIPTION OF THE INVENTION

Embodiments of the present invention will be described below with reference to the accompanying drawings.

First Embodiment

Figure 1:
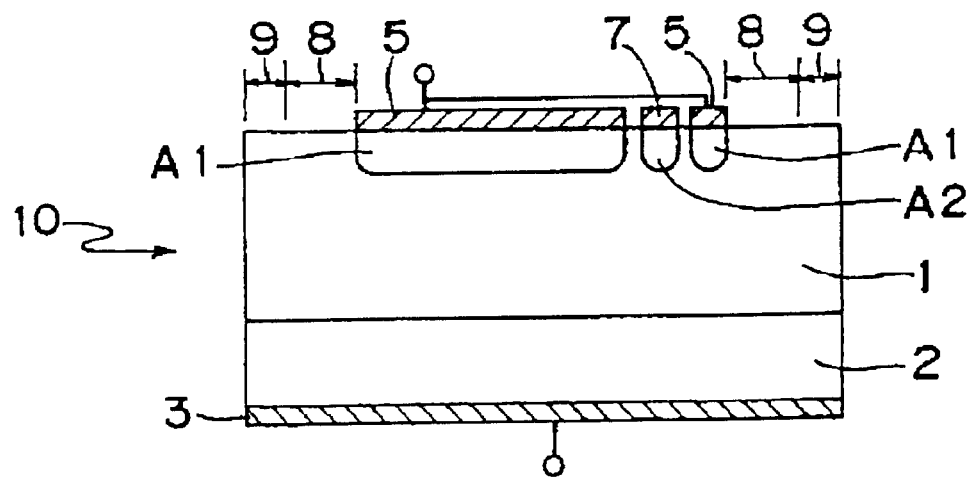
FIG. 1 is a longitudinal sectional view for explaining a semiconductor diode according to first embodiment of the present invention.
Figure 2:
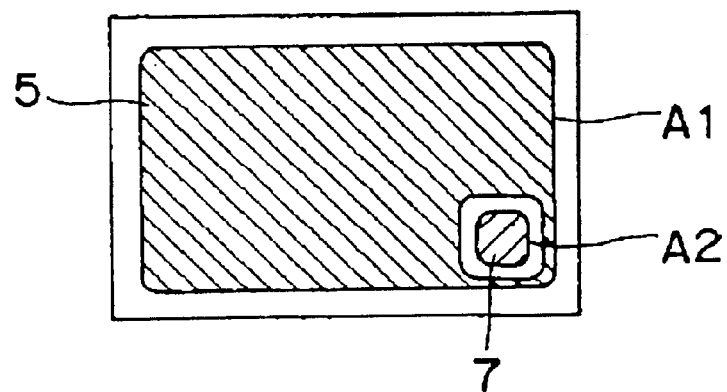
FIG. 2 is a plan view of a semiconductor diode according to first embodiment.

FIGS. 1 and 2 are a sectional view showing a semiconductor diode according to first embodiment of the present invention and a plan view showing the semiconductor diode, respectively. This semiconductor diode 10 has a first conductivity type of semiconductor substrate 1, a first conductivity type of cathode region 2 formed on the lower side of the semiconductor substrate 1 and having a cathode electrode 3 formed on the lower surface of the cathode region 2, and a second conductivity type of first anode region A1 formed to partially constitute the upper surface of the semiconductor substrate 1 and having an anode electrode 5 formed on the upper surface of the first anode region A1. In said substrate 1 of semiconductor diode 10, in order to assure withstand voltage characteristics which are equal to or better than predetermined withstand voltage characteristics, a peripheral region 8 surrounding the first anode region A1 is regulated, and a marginal region 9 surrounding the peripheral region 8 is regulated.

In first embodiment, one second anode region A2 is formed within the first anode region A1, and an anode electrode 7 is formed on the upper surface of the second anode region A2. The second anode region A2 is electrically isolated from the first anode region A1, and the anode electrode 7 formed on the upper surface of the second anode region A2 is independent of the anode electrode 5 formed on the upper surface of the first anode region A1.

Here, when the upper surface area of the first anode region A1 is represented by SA1, and the upper surface area of the second anode region A2 is represented by SA2, both the areas are set to satisfy the following relationship:

$$SA1 > SA2$$

When the upper surface area SA2 of the second anode region A2 is set as small as possible within the range in which the upper surface area SA1 can be measured, a diode current density increases. More specifically, a force current required to obtain a diode current density which is equal to or higher than a predetermined diode current density decreases.

Figure 3:
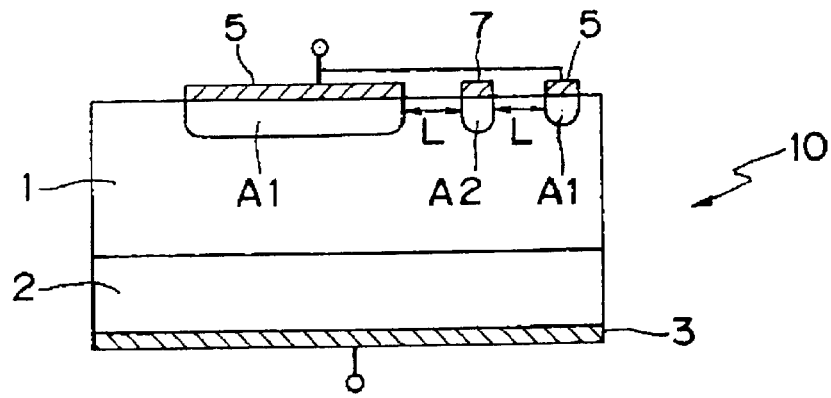
FIG. 3 is a sectional view showing intervals between anode regions in the semiconductor diode according to first embodiment of the present invention.

FIG. 3 is a sectional view showing an interval set between the first anode region A1 and the second anode region A2. In this case, the interval (indicated by L in FIG. 3) between the first anode region A1 and the second anode region A2 is preferably set to be 5 $\mu$m or more. When the first anode region A1 and the second anode region A2 are arranged at such interval, both the anode regions are electrically isolated from each other.

In the semiconductor diode 10 having the second anode region A2 described above, even though a small force current, measurement can be performed at a current density which is equal to or close to a rated current. As a result, the performance of a large current capacity chip can be recognized at high precision in an actual working current region, and the semiconductor diode 10 can effectively cope with feedback to wafer manufacturing steps or chip selection in parallel connection.

Figure 4A:
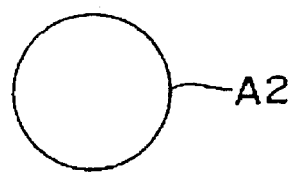
FIGS. 4A and 4B are plan views showing various shapes of auxiliary anode regions according to a modification of first embodiment.
Figure 4B:
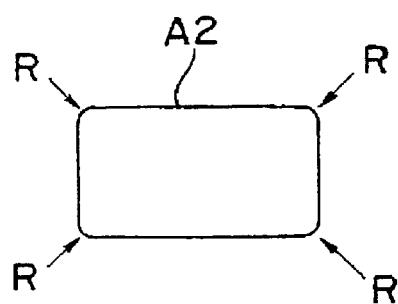

It is noted that the shape of the upper surface of the second anode region A2 is not limited to a square shown in FIG. 2. For example, as shown in FIG. 4A, the shape may be a circle, and, as shown in FIG. 4B, the shape may be a shape having radiuses of curvature which are equal to or larger than a predetermined radius of curvature at corners R. In this case, a current uniformly flows in the second anode region A2. More specifically, in order to prevent a current from being concentrated on one portion, the upper surface shape of the second anode region A2 preferably has radiuses of curvature of 10 $\mu$m or more at the corners.

Another embodiment of the present invention will be described below. The same reference numerals as in first embodiment denote the same parts in the other embodiment, and a description thereof will be omitted.

Second Embodiment

Figure 5:
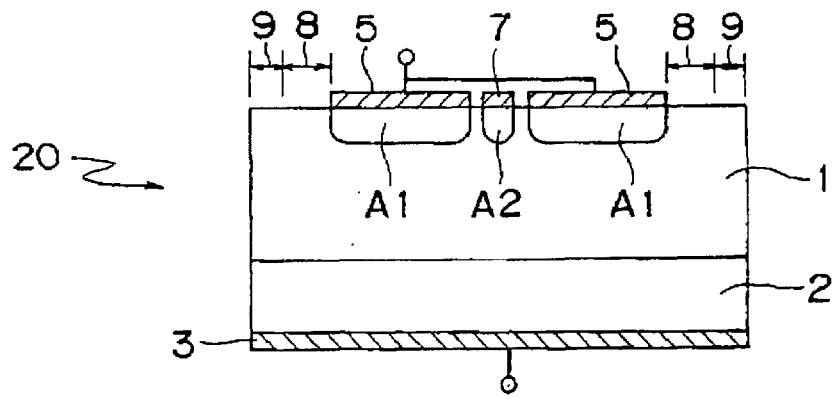
FIG. 5 is a longitudinal sectional view showing a semiconductor diode according to second embodiment of the present invention.
Figure 6:
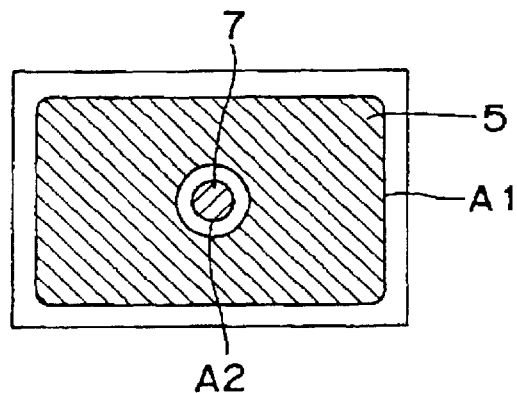
FIG. 6 is a plan view of a semiconductor diode according to second embodiment.

FIGS. 5 and 6 are a sectional view for explaining a semiconductor diode according to second embodiment of the present invention and a plan view showing the semiconductor diode, respectively. A semiconductor diode 20 has the same configuration as that of the semiconductor diode 10 according to first embodiment. In second embodiment, as in first embodiment, even though a force current is small, measurement can be performed at a current density which is equal to or close to a rated current.

In addition, in second embodiment, as is apparent from FIG. 6, the second anode region A2 is arranged at the center of a first anode region A1. In this manner, an operation, such as a wire bonding operation, for assembling a device can be preferably performed without being obstructed by the second anode region A2.

Third Embodiment

Figure 7:
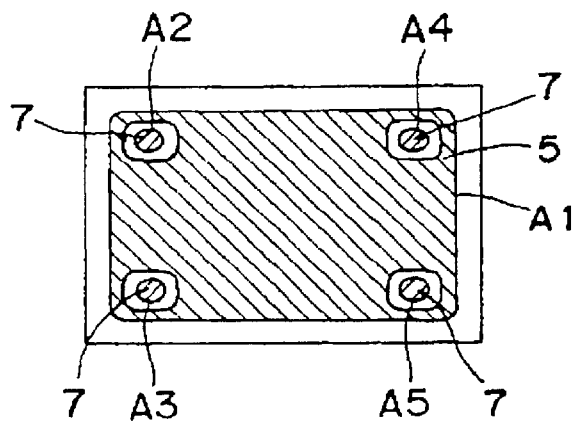
FIG. 7 is a plan view of a semiconductor diode according to third embodiment of the present invention.

FIG. 7 is a plan view of a semiconductor diode according to third embodiment of the present invention. In third embodiment, a plurality of (four) second anode regions A2 are formed within a first anode region A1, and the respective second anode regions A2 are formed at different corners on the upper surface of the first anode region A1. In this case, as in second embodiment, an operation, such as a wire bonding operation, for assembling a device can be preferably performed without being obstructed by the second anode regions A2.

Fourth Embodiment

Figure 8:
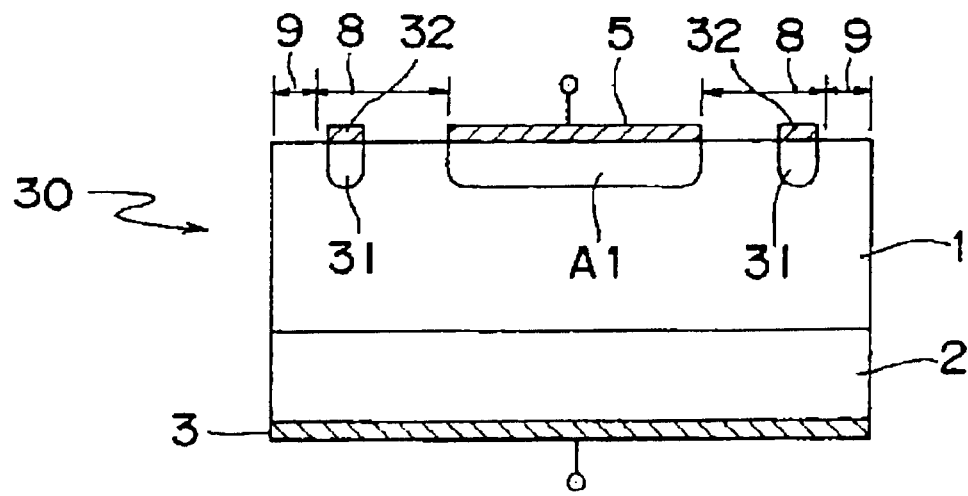
FIG. 8 is a longitudinal sectional view of a semiconductor diode according to fourth embodiment of the present invention.
Figure 9:
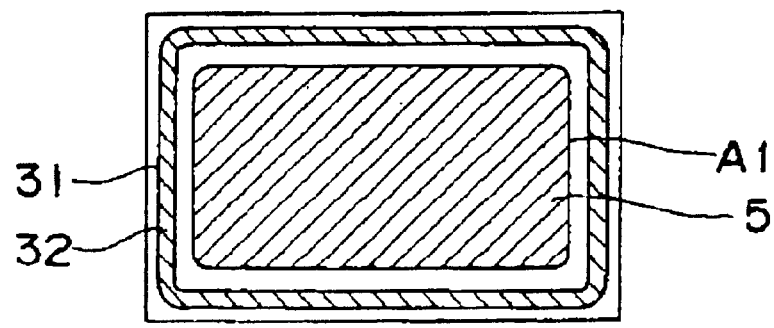
FIG. 9 is a plan view of a semiconductor diode according to fourth embodiment.

FIGS. 8 and 9 are a sectional view showing a semiconductor diode according to fourth embodiment of the present invention and a plan view showing the semiconductor diode, respectively. This semiconductor diode 30 does not have a second anode region PC formed within a first anode region A1, but has an almost annular second conductivity type of semiconductor layer 31 surrounding the first anode region A1. On the upper surface of the semiconductor layer 31, an electrode 32 is formed. The semiconductor layer 31 is electrically isolated from the first anode region A1. The electrode 32 formed on the upper surface of the semiconductor layer 31 is independent of an anode electrode 5 formed on the upper surf ace of the first anode region A1.

In the semiconductor diode 30 having the semiconductor layer 31 described above, as in first embodiment, even though a force current is small, measurement can be performed at a current density which is equal to or close to a rated current. In fourth embodiment, the semiconductor layer 31 is formed within a peripheral region 8, the same effect as described above can be obtained by using the structure of the conventional first anode region without changing the first anode region A1.

Fifth Embodiment

Figure 10:
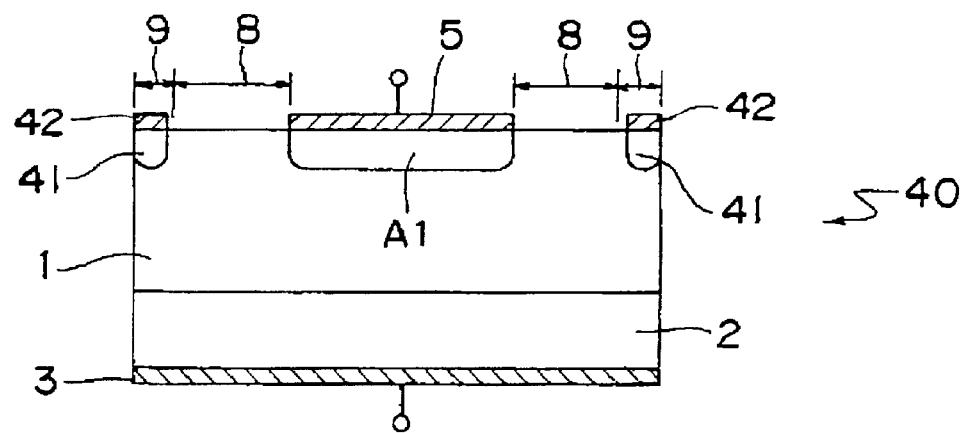
FIG. 10 is a longitudinal sectional view showing a semiconductor diode according to fifth embodiment of the present invention.
Figure 11:
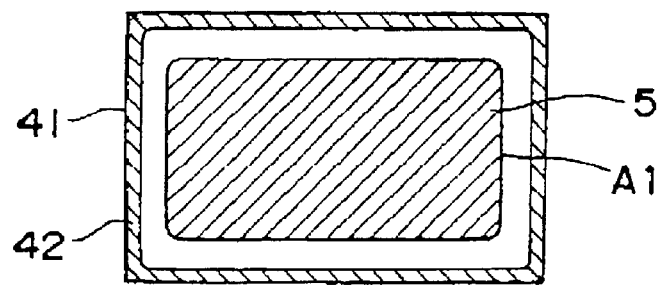
FIG. 11 is a plan view of a semiconductor diode according to fifth embodiment.

FIGS. 10 and 11 are a sectional view for explaining a semiconductor diode according to Fifth Embodiment of the present invention and a plan view of the semiconductor diode, respectively. A semiconductor diode 40 has the same configuration as that of the semiconductor diode 30 according to fourth embodiment. In fifth embodiment, an almost annular semiconductor layer 41 of a second conductivity type arranged within a marginal region 9 and surrounding a first anode region A1 is formed. On the upper surface of the semiconductor layer 41, an electrode 42 is formed.

In this case, as in the case of fourth embodiment, even though a force current is small, without changing the first anode region A1, by using the structure of the conventional anode region, measurement can be performed at a current density which is equal to or close to a rated current.

Sixth Embodiment

Figure 12:
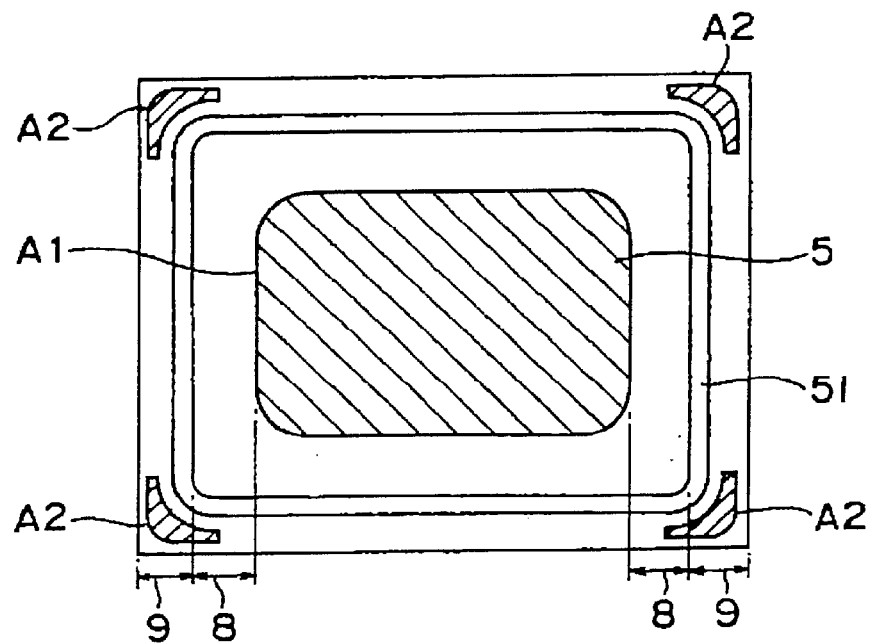
FIG. 12 is a plan view of a semiconductor diode according to sixth embodiment of the present invention.

FIG. 12 is a plan view of the semiconductor diode according to sixth embodiment of the present invention. This semiconductor diode 50 has a first or second conductivity type of an annular semiconductor layer 51, which is arranged within a marginal region 9 and surrounds the first anode region A1. Also, the semiconductor diode 50 has a second anode region A2 within regions (tour regions in this sixth embodiment) defined between the semiconductor layer 51 and each corner of the body. Each of second anode regions A2 is electrically isolated from the semiconductor layer 51 of a first or second conductor type.

Figure 13:
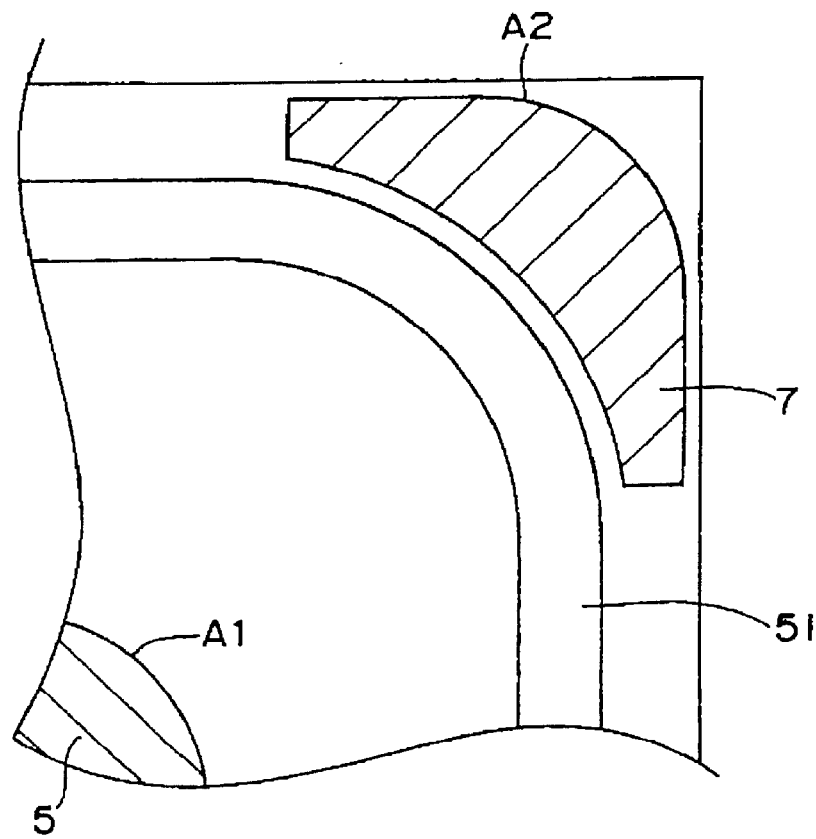
FIG. 13 is an expanded view showing one of the second anode regions formed in a semiconductor diode according to sixth embodiment.

FIG. 13 is an expanded view showing one of the second anode regions A2. The second anode regions A2 is formed along outer circumstance of the semiconductor layer 51 of a first or second conductor type and is shaped to curve with a predetermined radius of curvature on sides of the inner and outer circumstance, respectively. An electrode 7 is formed on upper surface of the second anode region A2, which is independent of the anode electrode 5 on the first anode region A1.

Since the second anode region A2 is an invalid region, when the invalid region is effectively used, a region for, e.g., a VF monitor need not be newly formed. As a result, a chip size can be avoided from being increased. In this case, the first anode region A1 need not be changed, and the structure of the conventional first anode region A1 can be used.

In this sixth embodiment, a semiconductor in which each of second anode regions A2 is formed within four regions defined between the semiconductor layer 51 of a first or second conductor type and each corner of the body, is exemplified, but the present invention is not limited to such exemplification. For example, the second anode region may be formed at at least one of the four corners of the body.

It is noted that the present invention is not limited to the illustrated embodiments, and various changes and modifications in design can be effected without departing from the spirit and scope of the present invention, as a matter of course.

What is claimed is:

1. A semiconductor device comprising: a first conductivity type of semiconductor substrate; a first conductivity type of cathode region formed on the lower side of the semiconductor substrate and having a cathode electrode formed on the lower surface of itself; a second conductivity type of first anode region formed to partially constitute the upper surface of the semiconductor substrate and having an anode electrode formed on the upper surface of itself; a peripheral region, formed to surround the first anode region, for assuring withstand voltage characteristics which are equal to or better than predetermined withstand voltage characteristics; and a marginal region formed to surround the peripheral region, characterized in that:

at least one second anode region is formed in the first anode region such that the second anode region is electrically isolated from the first anode region, and an electrode being independent of the anode electrode on the first anode region is formed on the upper surface of the second anode region.

2. The semiconductor device according to claim 1, characterized in that an upper surface area SA1 of the first anode region and an upper surface region SA2 of the second anode region satisfy a relationship represented by SA1>SA2.

3. The semiconductor device according to claim 1, characterized in that the upper surface shape of the second anode region has radiuses of curvature of not less than 10 $\mu$m at corners of the upper surface shape.

4. The semiconductor device according to claim 1, characterized in that an interval between the first anode region and the second anode region is set to be not less than 5 $\mu$m.

5. The semiconductor device according to claim 1, characterized in that the second anode region is arranged at almost center of the first anode region.

6. The semiconductor device according to claim 1, characterized in that a plurality of second anode regions are formed in the first anode region, and the respective second anode regions are arranged at different corners in the first anode region.

7. A semiconductor device comprising:

a first conductivity type semiconductor substrate;

a first conductivity type cathode region formed on a lower side of the semiconductor substrate and having a cathode electrode formed on a lower surface of the cathode region;

a second conductivity type first anode region formed to partially constitute a upper surface of the semiconductor substrate and having an anode electrode formed on the upper surface of the first anode region;

a peripheral region, formed to surround the first anode region, for assuring withstand voltage characteristics which are equal to or better than predetermined withstand voltage characteristics;

a marginal region formed to surround the peripheral region;

an annular second conductivity type semiconductor layer arranged within the peripheral region and surrounding the first anode region; and an electrode being independent of the anode electrode on the first anode region and formed on the upper surface of the annular second conductivity type semiconductor layer.

8. A semiconductor device comprising:

a first conductivity type semiconductor substrate;

a first conductivity type cathode region formed on a lower side of the semiconductor substrate and having a cathode electrode formed on a lower surface of the cathode region;

a second conductivity type first anode region formed to partially constitute an upper surface of the semiconductor substrate and having an anode electrode formed on an upper surface of the first anode region;

a peripheral region, formed to surround the first anode region, for assuring withstand voltage characteristics which are equal to or better than predetermined withstand voltage characteristics;

a marginal region formed to surround the peripheral region;

an annular second conductivity type semiconductor layer arranged within the marginal region and surrounding the first anode region; and an electrode being independent of the anode electrode on the first anode region and formed on the upper surface of the annular second conductivity type semiconductor layer.

9. A semiconductor device comprising:

a first conductivity type semiconductor substrate;

a first conductivity type cathode region formed on the lower side of the semiconductor substrate and having a cathode electrode formed on a lower surface of the cathode region;

a second conductivity type first anode region formed to partially constitute an upper surface of the semiconductor substrate and having an anode electrode formed on the upper surface of the first anode region;

a peripheral region, formed to surround the first anode region, for assuring withstand voltage characteristics which are equal to or better than predetermined withstand voltage characteristics;

a marginal region formed to surround the peripheral region;

an annular first or second conductivity type semiconductor layer surrounding the first anode region and formed within the marginal region;

a second anode region electrically isolated from the first or second conductivity type of semiconductor layer formed within a region defined between the annular first or second conductivity type semiconductor layer and outer corners of the marginal region; and an electrode being independent of the anode electrode on the first anode region and formed on the upper surface of the second anode region.

* * * * *